United States Patent
Andreev et al.

(10) Patent No.: US 7,082,561 B2
(45) Date of Patent: Jul. 25, 2006

(54) BUILT-IN FUNCTIONAL TESTER FOR SEARCH ENGINES

(75) Inventors: Alexander E. Andreev, San Jose, CA (US); Anatoli A. Bolotov, Cupertino, CA (US); Nikola Radovanovic, Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 995 days.

(21) Appl. No.: 10/135,624

(22) Filed: Apr. 30, 2002

(65) Prior Publication Data

US 2003/0204799 A1 Oct. 30, 2003

(51) Int. Cl.
*G01R 31/28* (2006.01)
(52) U.S. Cl. .................... 714/733; 714/739; 714/741
(58) Field of Classification Search ............... 709/202, 709/238; 707/5; 704/7; 714/733, 739, 741
See application file for complete search history.

(56) References Cited

U.S. PATENT DOCUMENTS

| | | | | |
|---|---|---|---|---|
| 5,905,862 | A * | 5/1999 | Hoekstra | 709/202 |
| 6,269,364 | B1 * | 7/2001 | Kennedy et al. | 707/5 |
| 6,308,220 | B1 * | 10/2001 | Mathur | 709/238 |
| 6,721,736 | B1 * | 4/2004 | Krug et al. | 707/5 |
| 6,745,161 | B1 * | 6/2004 | Arnold et al. | 704/7 |
| 6,829,606 | B1 * | 12/2004 | Ripley | 707/5 |
| 6,999,959 | B1 * | 2/2006 | Lawrence et al. | 707/5 |

* cited by examiner

*Primary Examiner*—David Ton
(74) *Attorney, Agent, or Firm*—Suiter West Swantz PC LLO

(57) ABSTRACT

A search engine apparatus having a built-in functional test may include an input generator, a search engine, a pseudo search engine and a comparator. The inputs generator is suitable for generating outputs including commands and points associated with the commands. The search engine and the pseudo search engine are communicatively coupled to the inputs generator. The search engine suitable for performing search and edit operations and the pseudo search engine is suitable for simulating the search engine by generating pseudo search engine outputs. The comparator is communicatively coupled to the search engine and the pseudo search engine, and is suitable for comparing outputs received from the search engine and pseudo search engine.

21 Claims, 3 Drawing Sheets

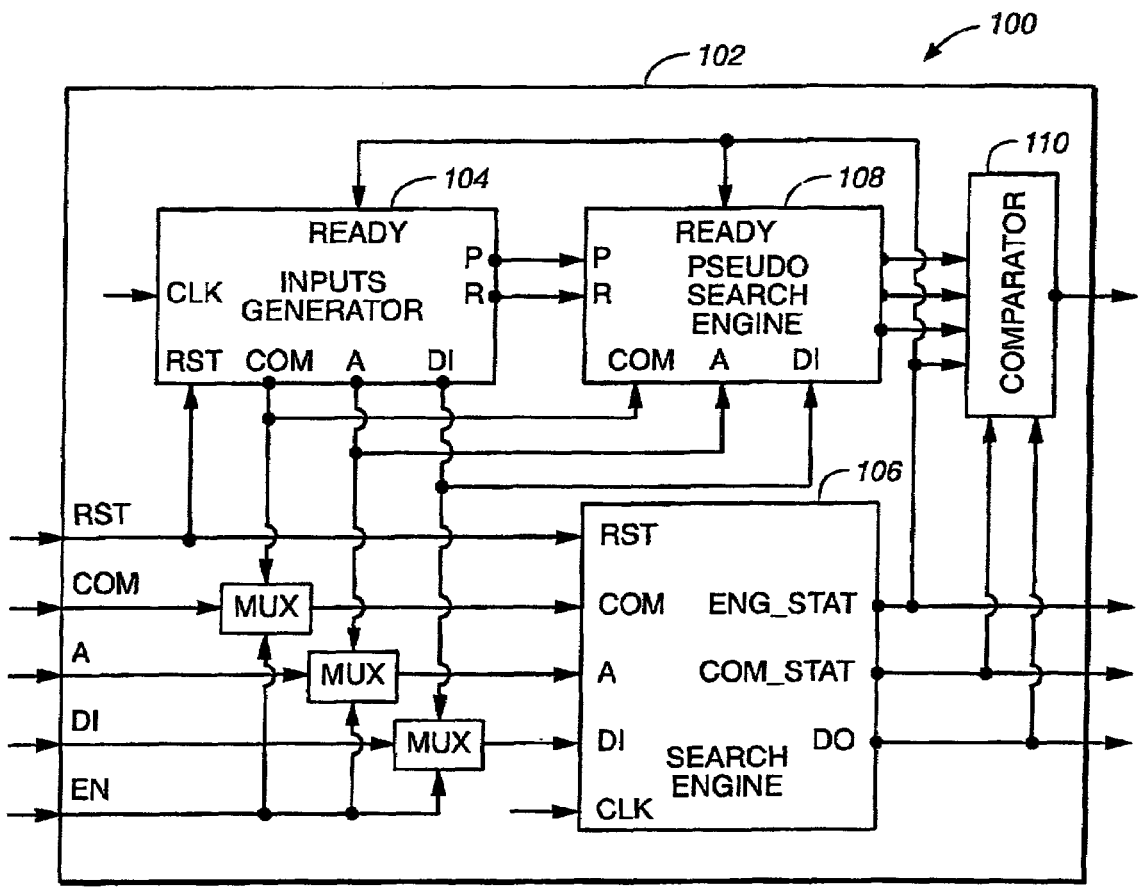
FIG._1
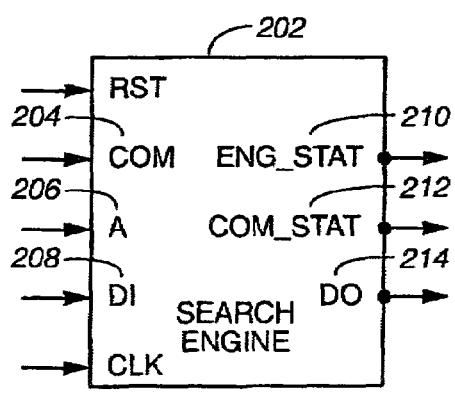
FIG._2

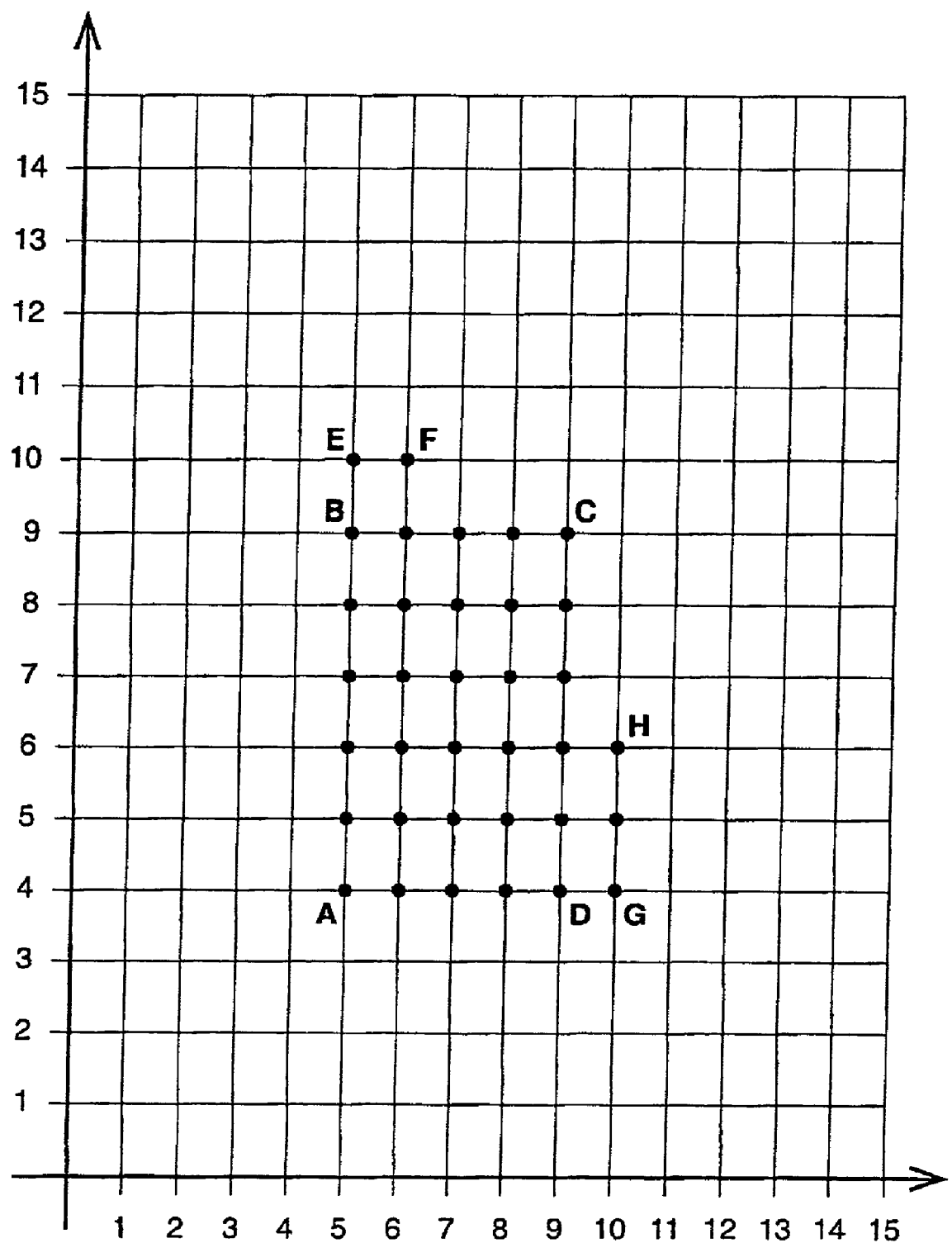
FIG._3

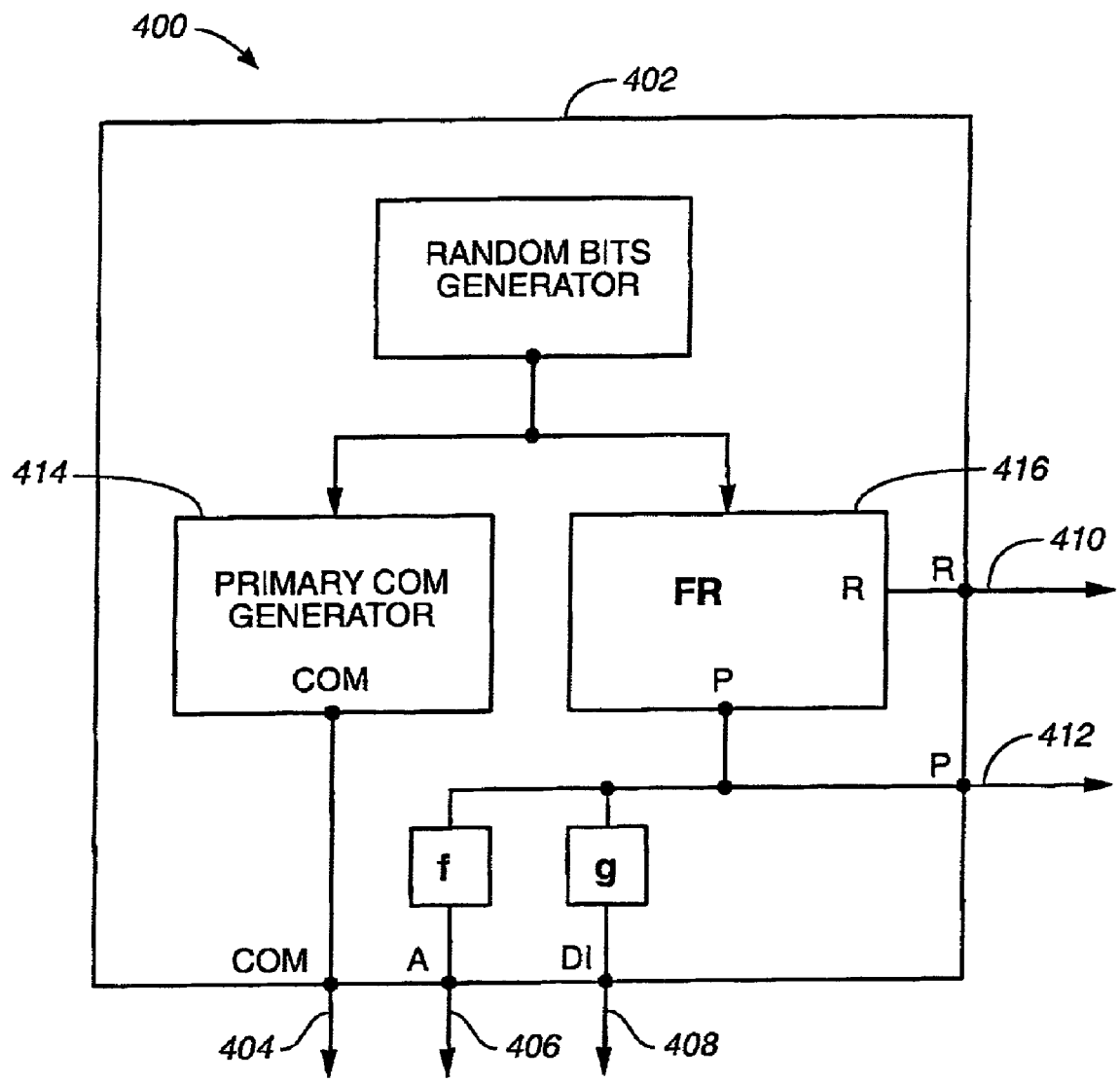
FIG._4

BUILT-IN FUNCTIONAL TESTER FOR SEARCH ENGINES

FIELD OF THE INVENTION

The present invention generally relates to the field of search engines, and particularly to a built-in functional tester for search engines.

BACKGROUND OF THE INVENTION

The complexity encountered in designing integrated circuits increases greatly as the functional count of the integrated circuit increases. For example, in synthesis practice of very large scale integration (VLSI) designs, verification and testing problems play a major role in the final stages of development and designing. Especial difficulty is the testing of netlists and chips with complex sequential behavior, such as those found in search engines of different natures.

For instance, data communications are most often accomplished by sending a group of data in a packet, together with the address of the location for which the data is intended. A search for data may be accomplished by conducting a binary search based on the address or prefix where the data are retained, or stored, and the data returned in a packet to the requesting address. The search is conducted by a lookup procedure that matches the query address with the stored address. Therefore, a search engine provided to enable the search of the data needs to demonstrate such capabilities in a manner consistent with the contemplated usage of the search engine.

Therefore, it would be desirable to provide a built-in functional tester for search engines.

SUMMARY OF THE INVENTION

Accordingly, the present invention is directed to a search engine apparatus including a built-in self tester. In an aspect of the present invention, a search engine apparatus having a built-in functional test includes an inputs generator, a search engine, a pseudo search engine and a comparator. The inputs generator is suitable for generating a random flow of commands which are associated with points. The search engine and the pseudo search engine are communicatively coupled to the inputs generator, the pseudo search engine suitable for simulating the search engine. The comparator is communicatively coupled to the search engine and the pseudo search engine, and is suitable for comparing outputs received from the search engine and pseudo search engine.

In an additional aspect of the present invention, a search engine apparatus having a built-in functional test includes an inputs generator, a search engine, a pseudo search engine and a comparator. The inputs generator is suitable for generating inputs including commands and points associated with the commands. The search engine and the pseudo search engine are communicatively coupled to the inputs generator. The search engine suitable for performing search and edit operations and the pseudo search engine is suitable for simulating the search engine by generating pseudo search engine outputs. The comparator is communicatively coupled to the search engine and the pseudo search engine, and is suitable for comparing outputs received from the search engine and pseudo search engine.

In a further aspect of the present invention, a method for testing a search engine includes generating inputs including at least one search command, data corresponding to the search command, a point and a rectangle. The generated search command and data corresponding to the search command is transferred to a search engine. The generated search command, data corresponding to the search command, point and rectangle are transferred to a pseudo search engine. Search engine outputs are produced by the search engine from the transferred search command and data, the search engine outputs including status of a completed command and outputted data of a completed command. Pseudo search engine outputs are produced by the pseudo search engine from the transferred search command, data, point and rectangle, the pseudo search engine outputs including pseudo status of a completed command and pseudo outputted data of a completed command. The search engine outputs are then compared with the pseudo search engine outputs.

In an aspect of the present invention, a search engine apparatus having a built-in functional tester includes a means for generating an input, the input generating means having outputs including commands and points associated with the commands. A means for searching is communicatively coupled to the input generating means, the searching means suitable for performing search and edit operations. A means for pseudo searching is also communicatively coupled to the input generating means, the pseudo searching means suitable for generating pseudo search engine outputs. A means for comparing is communicatively coupled to the searching means and the pseudo searching means, the comparing means suitable for comparing outputs received from the searching means and pseudo searching means It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is a block diagram of an embodiment of the present invention wherein a search engine apparatus including a built-in tester is shown;

FIG. 2 is an illustration of an embodiment of the present invention wherein an exemplary search engine of the search engine apparatus of FIG. 1 is shown;

FIG. 3 is an exemplary "floating" rectangle suitable for use through the present invention; and FIG. 4 is an illustration of an embodiment of the present invention wherein an exemplary inputs generator of the search engine apparatus of FIG. 1 is shown.

DETAILED DESCRIPTION OF THE INVENTION

Reference will now be made in detail to the presently preferred embodiments of the invention, examples of which are illustrated in the accompanying drawings.

Referring generally now to FIGS. 1 through 4, exemplary embodiments of the present invention are shown. The present invention provides a new device which may be built into a search engine and performs functional testing.

In synthesis practice of very large scale integration (VLSI) designs, verification and testing problems play a major role on final stages of development and designing. Especial difficulty is the testing of netlists and chips with complex sequential behavior (functioning), such as that found in search engines of different natures, such as the search engine described in U.S. patent application Ser. No. 09/678,313, titled "Fast Flexible Search Engine for Perfect Match" filed Oct. 4, 2000; and U.S. patent application Ser. No. 09/678,313, titled "Fast Flexible Search Engine for Longest Prefix Match" filed Oct. 4, 2000, which are herein incorporated by reference in their entirety.

One of the basic practical methods to prove correctness of functioning for search engines is by all-round verification by means of sequential testers that simulate real usage of such search engines in practice. Built-in testers may be used as functional testers for netlists and chip testing. Preferably, the built-in testers are not large but, at the same time, close enough to model the real practices of chip usage.

In the present invention a built-in functional tester for simulation and testing of search engines is provided. This tester may generate, according to a specified general scenario, a random flow of command and inputs which imitate inputs of real chip work. Thus, the present invention may provide built-in sequential testers, for use in search engine simulation and testing and the like as contemplated by a person of ordinary skill in the art.

The tester of the present invention has a variety of features, including the following: (1) built-in; (2) sequential; (3) functional; (4) small size; (5) completeness; and (6) provides different scenarios. It should be also noted that a software model, such as a C/C++ model, of the tester may also be used as external tester or in co-modeling testing of search engines without departing from the spirit and scope of the present invention.

For example, the listing below includes exemplary main parts of co-modeling testing of search engine with a IKOS V-Station:

1. C/C++ testbench model abstract the tester which generates inputs for design and compare outputs.
2. Transaction Interface Portal which defines C functions for initialization, transfer of data, clock manipulation and so on.
3. RTL Transactor enables communication between the tester on workstation side and search engine design on V-Station side.

Referring now to FIG. 1, an embodiment 100 of the present invention is shown wherein a search engine apparatus includes a built-in tester. The search engine apparatus 102 includes an inputs generator 104, a search engine 106, a pseudo search engine 108 and a comparator 110. The inputs generator 104 supplies inputs to both the search engine 106 and the pseudo search engine 108. The comparator 110 compares outputs of the search engine 106 and pseudo search engine, and handles and processes encountered errors, if any. Each of the modules will be described in greater detail in the following discussion.

Search Engine and the Commands SEARCH, INSERT AND DELETE

Schematically, search engine (SE or engine for short) may be represented by the module depicted in the embodiment 200 shown in FIG. 2. Search Engine 202 is a functional module for searching and editing (searching or deleting) entries. Each entry E may include a pair of the form (addr, dat), where addr is an address in address space and dat is a data associated with it. Additionally, data dat may be written at address addr in engine memory.

Both addr and dat are binary vectors of a dimensionality a_width and d_width consequently. Capacity of the search engine to store entries is limited by parameter engine_capacity. It should be noted that capacity of address space usually exceeds engine_capacity.

The search engine 202 may be thought to function in discrete moments of time denoted as t=0,1,2,3, . . . , etc. The search engine 202 has a 2-bit input COM 204, a_width-bit input A 206 for input addresses and d_width-bit input DI (data_in) 208 for input data. The search engine 202 also has two 2-bit outputs COM_STAT 212 and ENG_STAT 210 for the status of a completed command and for the current engine status, consequently. Finally, d_width-bit output DO (data_out) 214 is provided for data outputs.

Output COM_STAT 212 may code possible status of the completed command, such as the indicated status from the following list: (1) "Completed successfully"; (2) "Not found"; (3) "Already exist"; and (4) "Ignored".

Output DO 214 includes the outputted data of a completed command. Both outputs DO 214 and COM_STAT 212 may be computed for a given command with a latency equal to latency_delay.

Output ENG_STAT 210 may code for status of the engine, such as the indicated status from the following list: (1) "Ready"; (2) "Busy"; and (3) "Ready and Full".

Preferably, if at the current moment t engine status is "Ready", the status of the search engine will not change until a new edit command (INSERT or DELETE) is received. Then, at next moment ENG_STAT 210 will be changed to "Busy".

If engine status at some moment is "Busy", for instance, the search engine is performing an editing function, then for a new editing command, arriving on the engine input COM 204 at moment t, the command status COM_STAT 212 computed at the moment t+latency_delay will be "Ignored" and output data DO 214 will be set to zero.

Engine status "Busy" remains unchanged until the search engine 202 finishes performing an editing command. It may take a nondeterministic time depending on the editing algorithm implemented by the search engine 202. When finishing the performance of the last editing command, engine status becomes "Ready". If at that time total number of entries in engine memory has reached its maximum, then the search engine 202 status will be "Ready and Full".

If search engine 202 status is "Ready and Full" then it is ready for DELETE command only and command status for arriving INSERT command will be then computed as "Ignored".

Engine Commands

At every moment of time t, the search engine may be given one of the following commands: (1) SEARCH; or editing commands (2) INSERT or (3) DELETE. Let input address at moment t be equal to addr, A=addr, and input data be equal to input_dat, DI=input_dat.

Command SEARCH may be performed and is not dependent on engine status. For instance, if SEARCH command arrives at the moment t then search engine will begin to perform it regardless of engine status and later engine output the search result as described. This command looks at engine memory for data written at input address addr. If there exists in engine memory entry E=(addr, some_dat) then at the moment t+latency_delay COM_STAT will be set to "Completed successfully" and DO will output at that moment some_dat, i.e. DO=some_dat. Otherwise at the moment t+latency_delay COM_STAT will be set to "Not found" and DO=0.

Command DELETE is performed only if current engine status is "Ready" or "Ready and Full". This command also looks to engine memory for entry E=(addr, some_dat) with given address addr. If the search engine finds such an entry E, then at the moment t+latency_delay COM_STAT will be set to "Completed successfully" and DO will output at that moment some_dat, DO=some_dat.

Finally, command INSERT is performed only if current search engine status is "Ready". Like in the case of other engine commands, this commands looks to search engine memory for entry E=(addr, some_dat) with given address addr. If the search engine finds such an entry E, it outputs at the moment t+latency_delay output COM_STAT "Already exist" and DO=some_dat. Otherwise, the search engine will write into its memory new entry E=(addr, input_dat) and output at the moment t+latency_delay COM_STAT "Completed successfully" and DO=input_dat.

Floating Rectangle on Torus

Floating Rectangle (FR or rectangle for short) is a core construction for generating random entries. The floating rectangle may appear as a rectangular grid of integers ABDC, as shown in FIG. 3, and may include two incomplete lines, such as the one adjusting to the left or to the top of rectangle (for insertion new points) and another adjusting to the right or to the bottom of it (for deletion of existing points).

In FIG. 3, insertion line EF is depicted on the top (but it might also be to the left) of rectangle ABCD and deletion line GH depicted to the right (though it could also be at the bottom) of the rectangle.

Insertion and deletion operations may be performed with the rectangle. When performing an insertion operation, a new point is added to the rectangle, chosen from the insertion line. For example, for the rectangle depicted in FIG. 3, the new point will be the point next to point F. If a complete line is obtained after insertion, the new line is added to the rectangle. If no insertion line is available in the beginning, then a new insertion line may be chosen from two adjusting sides, such as one from the top or right to the left of rectangle. Actual choice may be determined by a random bit.

When performing deletion operations, a point is deleted from a deletion line. For example, for the rectangle depicted in FIG. 3, the point may be point H. If a deletion line is not available, a new deletion line may be chosen from two adjusting sides, such as from the right side or another from the bottom of rectangle. Again, the choice may be determined by a random bit.

When doing insertion and deletion operations with the rectangle, arithmetic operations may be performed with integers by modulo Mod. In that sense, a rectangle is provided which is randomly floating on torus Tor={0, . . . Mod−1}×{0, . . . Mod−1}. The parameter Mod is chosen so that at least (Mod−1)$^2$ is not less than engine_capacity.

Besides the described insertion and deletion operations, search operations may also be performed, such as for a given point to decide whether this point is/is not from the rectangle. Note that this operation does not change the rectangle.

Random Flow of Primary Commands

Using an appropriate random bit generator, the following primary commands (preferably, one at a time) are generated at the discrete moments of time t=0,1, . . . according to a preset distribution of probability, the commands may include com_search, com_search_inside, com_insert, com_insert_inside, com_delete, and com_del At Point P from the torus Tor is associated with each of these commands. For example, for command com-search P is chosen as a random point from Tor; for commands com_search_inside and com_insert_inside P is chosen as a random point from a current rectangle; for command com_delete_outside P is chosen as a random point from outside of the current rectangle. It should be noted that these commands do not change the floating rectangle.

For command com_insert, the current rectangle R operation insertion is applied and thus point P is inserted to the rectangle. This point P is associated with the given command com_insert.

In the case of command com_delete, a similar process is undertaken. A deletion operation is applied to the current rectangle R and thus point P is obtained as deleted from the rectangle.

As a result of operation of insertion or deletion performed, at the same moment of time new rectangle R_new is obtained. It should be noted that actual changing, i.e. switching, from rectangle R to rectangle R_new may depend on the auxiliary flag Ready. If Ready=0, old rectangle R is left at the next moment of time without changes. If Ready=1, then the current rectangle is switched to R_new, i.e. at next moment of time R_new becomes current rectangle. Flag Ready may be computed for each moment of time from the output ENG_STAT of search engine, for instance, if ENG_STAT is "Ready" or "Ready and Full" then Ready is set equal to 1, and if ENG_STAT is "Busy" then Ready is set equal to zero.

The number of points in the rectangle is also followed. This number may be denoted as count. If count reaches a maximal value equal to engine_capacity, the probability of primary commands may be changed to force the rectangle to move to an empty state (i.e., count=0) and if the rectangle becomes empty, the probability may again be changed in order to force the rectangle to move to full state (count=engine_capacity). It should be noted that a more complex scenario may be preset by establishing rules of probability changes and managing of the flow of primary commands.

It should also be noted that in the case when count=0 or count=engine_capacity, the flow of primary commands may be corrected. For instance, to avoid errors, come_insert generated when count=engine_capacity is changed to command com_insert_inside; similarly, com_delete generated when count=0 is changed to command com_delete_outside. Associated points are changed correspondingly.

Inputs Generator

Referring now to FIG. 4, an exemplary embodiment 400 of the present invention is shown wherein an inputs generator of FIG. 1 is shown. The inputs generator 402 module supplies inputs COM 404, A 406 and DI 408 for the search engine and also inputs R 410 and P 412 for its pseudo twin the pseudo search engine (PSE or pseudo engine for short). The inputs generator 402 includes module primary command generator 414, instantiated inside, which generates a random flow of primary commands and associated with points from a point generator, such as a floating rectangle 416 or from torus as described previously.

This module has one 1-bit input Ready, as shown in FIG. 1, which controls rectangle switching from current rectangle R to the new rectangle R_new if necessary.

To compute output Com 404, primary commands are re-denoted into engine commands, for example com_search and com_search_inside become simply engine SEARCH command; com_insert and com_insert_inside become engine INSERT command; com_delete and com_delete_outside become engine DELETE command.

To compute address for output A 406, f is mapped from torus Tor to an address space of the engine. The mapped f embedded torus points into the address space of engine is done almost uniformly. Where P is a current point associated with primary command, addr is set equal to f(P).

Input_data for the input DI is computed in a similar way by mapping g from torus to the data space of the engine. Where P as a current point, input_data is set equal to g(P). It should be noted that a nonzero input_data value is needed only in the case of engine command INSERT.

Point P and parameters describing current rectangle R are also passed to pseudo search engine via inputs generator 402 outputs P 410 and R 412 to pseudo engine inputs P and R consequently, as shown in FIG. 1.

Pseudo Search Engine

Pseudo search engine has the same inputs and outputs as search engine has plus extra inputs P and R for point R and a few parameters that completely describe rectangle R.

This pseudo engine is able to simulate the search engine and may correctly compute and predict "real" search engine outputs besides ENG_STAT. In embodiments of the invention, pseudo engine cannot predict the moment when ENG_STAT changes from "Busy" to "Ready" or "Ready and Full", but this is nonessential for simulation and testing.

First, for current point P and rectangle R, three flags are computed: (1) search_flag; (2) insertion_flag; and (3) deletion_flag.

Search_flag is equal to one if point P belongs to R, and is equal to zero, otherwise. Insertion_flag is equal to zero if point P can be computed by applying an insertion operation to current rectangle R, and is set equal to zero, otherwise. Similarly, deletion_flag is set equal to zero if point P can be computed by applying deletion operation to current rectangle R and zero otherwise.

By knowing these three flags plus flag Ready, outputs COM_STAT and DO may be computed without delay for the current engine command. After that, the outputs may be delayed with latency_delay and then output for further comparison with "real" engine outputs.

For engine command SEARCH, if search_flag is equal to one, COM_STAT is set equal to "Completed successfully" and DI is set to g(P), where g is data transforming mapping as described above. Otherwise COM_STAT is set equal to "Not found" and DI is set equal to zero.

For both engine commands INPUT and DELETE, if flag Ready is equal to zero, COM_STAT is equal to "Ignored" and DI is set to zero.

For engine command INSERT in the case flag Ready is equal to one, if search_flag is equal to one and insertion_flag is zero, COM_STAT is equal to "Already exist" and DI is set to g(P). If search_flag is equal to zero and insertion_flag is one, COM_STAT is set equal to "Completely successfully" and DI is set to g(P). Other flag value combinations are illegal and the pseudo engine reports an error.

For engine command DELETE, if flag Ready is equal to one, if search_flag is one and delete_flag is one, COM_STAT is set equal to "Completed successfully" and DI is set equal to g(P). If search_flag is equal to zero and deletion_flag is equal to one, COM_STAT is set equal to "Not found" and DI is set to zero. Other flag value combinations are illegal and pseudo engine reports an error.

It should be noted that the pseudo engine may also correctly update full_flag, i.e. flag indicated whether engine memory is already full or not. This flag may be used in a comparator module for comparison with what is obtained from "real" search engine output ENG_STAT.

Comparator

Comparator module is a simple module but it plays an important role, it compares outputs of both engines and handles and processes possible errors if any. If Enable_built_in_test flag from input EN is equal to zero, the comparator does nothing (more precisely, its outputs are ignored).

It is believed that the system, method and apparatus of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A search engine apparatus having a built-in functional tester, comprising:
an inputs generator suitable for generating a random flow of commands which are associated with points;
a search engine communicatively coupled to the inputs generator;
a pseudo search engine communicatively coupled to the inputs generator, the pseudo search engine suitable for simulating the search engine; and
a comparator communicatively coupled to the search engine and the pseudo search engine, the comparator suitable for comparing outputs received from the search engine and pseudo search engine.

2. The search engine apparatus as described in claim 1, wherein the pseudo search engine is suitable for at least one of computing and predicting at least one search engine output.

3. The search engine apparatus as described in claim 1, wherein the comparator processes errors identified through the comparison of the outputs received from the search engine and the pseudo search engine.

4. The search engine apparatus as described in claim 1, wherein the inputs generator includes a primary command generator, a random bits generator and a point generator.

5. The search engine apparatus as described in claim 4, wherein the point generator computes points through use of at least one of a floating rectangle and torus.

6. The search engine apparatus as described in claim 1, wherein the inputs generator supplies inputs command (COM), input address (A) and input data (DI) to the search engine and supplies inputs command (COM), input address (A), input data (DI), point (P) and rectangle (R) to the pseudo search engine.

7. The search engine apparatus as described in claim 1, wherein the search engine apparatus including the input generator, search engine, pseudo search engine and comparator is instantiated as a single integrated circuit.

8. The search engine apparatus as described in claim 1, wherein the search engine is suitable for performing searching and editing operations.

9. The search engine apparatus as described in claim 8, wherein the search engine has outputs including status of a completed command (COM_STAT), outputted data of a completed command (DO) and status of the search engine (ENG_STAT).

10. A search engine apparatus having a built-in functional tester, comprising:
- an inputs generator suitable for generating inputs including commands and points associated with the commands;
- a search engine communicatively coupled to the inputs generator, the search engine suitable for performing search and edit operations;
- a pseudo search engine communicatively coupled to the inputs generator, the pseudo search engine suitable for simulating the search engine by generating pseudo search engine outputs; and
- a comparator communicatively coupled to the search engine and the pseudo search engine, the comparator suitable for comparing outputs received from the search engine and pseudo search engine.

11. The search engine apparatus as described in claim 10, wherein the pseudo search engine is suitable for at least one of computing and predicting at least one search engine output.

12. The search engine apparatus as described in claim 10, wherein the comparator processes errors identified through the comparison of the outputs received from the search engine and the pseudo search engine.

13. The search engine apparatus as described in claim 10, wherein the inputs generator includes a primary command generator, a random bits generator and a point generator.

14. The search engine apparatus as described in claim 13, wherein the point generator computes points through use of at least one of a floating rectangle and torus.

15. The search engine apparatus as described in claim 10, wherein the inputs generator supplies inputs command (COM), input address (A) and input data (DI) to the search engine and supplies inputs command (COM), input address (A), input data (DI), point (P) and rectangle (R) to the pseudo search engine.

16. The search engine apparatus as described in claim 10, wherein the search engine apparatus including the input generator, search engine, pseudo search engine and comparator is instantiated as a single integrated circuit.

17. The search engine apparatus as described in claim 10, wherein the search engine has outputs including status of a completed command (COM_STAT), outputted data of a completed command (DO) and status of the search engine (ENG_STAT).

18. A method for testing a search engine, comprising:
- generating inputs including at least one search command, data corresponding to the search command, a point and a rectangle;
- transferring the generated search command and data corresponding to the search command to a search engine;
- transferring the generated search command, data corresponding to the search command, point and rectangle to a pseudo search engine;
- producing search engine outputs by the search engine from the transferred search command and data, the search engine outputs including status of a completed command and outputted data of a completed command;
- producing pseudo search engine outputs by the pseudo search engine from the transferred search command, data, point and rectangle, the pseudo search engine outputs including pseudo status of a completed command and pseudo outputted data of a completed command; and
- comparing the search engine outputs with the pseudo search engine outputs.

19. The method as described in claim 18, wherein generating inputs includes use of a floating rectangle.

20. A search engine apparatus having a built-in functional tester, comprising:
- a means for generating an input, the input generating means having outputs including commands and points associated with the commands;
- a means for searching communicatively coupled to the input generating means, the searching means suitable for performing search and edit operations;
- a means for pseudo searching communicatively coupled to the input generating means, the pseudo searching means suitable for generating pseudo search engine outputs; and
- a means for comparing communicatively coupled to the searching means and the pseudo searching means, the comparing means suitable for comparing outputs received from the searching means and pseudo searching means.

21. The search engine apparatus as described in claim 20, wherein the pseudo searching means is suitable for at least one of computing and predicting at least one search engine output.

* * * * *